United States Patent
Ireland

[19]

[11] Patent Number: 5,909,704
[45] Date of Patent: Jun. 1, 1999

[54] HIGH SPEED ADDRESS GENERATOR

[75] Inventor: Thomas C. Ireland, Torrance, Calif.

[73] Assignee: Raytheon Company, Lexington, Mass.

[21] Appl. No.: 08/702,826

[22] Filed: Jan. 9, 1997

[51] Int. Cl.[6] .......................... G06F 13/366; G06F 12/00
[52] U.S. Cl. ........................ 711/219; 711/218; 711/220; 711/149
[58] Field of Search ................... 711/1, 3, 131, 711/149, 213, 218, 219, 220

[56]  References Cited

U.S. PATENT DOCUMENTS

| 4,292,674 | 9/1981 | Scheuneman | 711/3 |
| 4,949,301 | 8/1990 | Joshi et al. | 711/100 |
| 5,337,045 | 8/1994 | Shirasaka | 340/825.52 |
| 5,519,872 | 5/1996 | Khandekar et al. | 711/219 |
| 5,546,592 | 8/1996 | Simpson | 711/219 |

*Primary Examiner*—Eddie P. Chan
*Assistant Examiner*—Yamir Encarnación
*Attorney, Agent, or Firm*—Leonard A. Alkov; Glenn H. Lenzen, Jr.

[57] ABSTRACT

An address generator (10) adapted for use with a first address source (12) and a second address source (14). The inventive generator (10) includes a first circuit (18–36) for selectively applying the address provided by the first (12) or the second (14) address source to a memory (44) during a first clock cycle. A second circuit (46, 48) detects a selection of an address provided by an address source for application during successive clock cycles and provides a control signal in response thereto. A third circuit (38, 40) increments or decrements the address and a fourth circuit (42) applies the output of the third circuit to the memory (44) in response to the control signal.

12 Claims, 2 Drawing Sheets

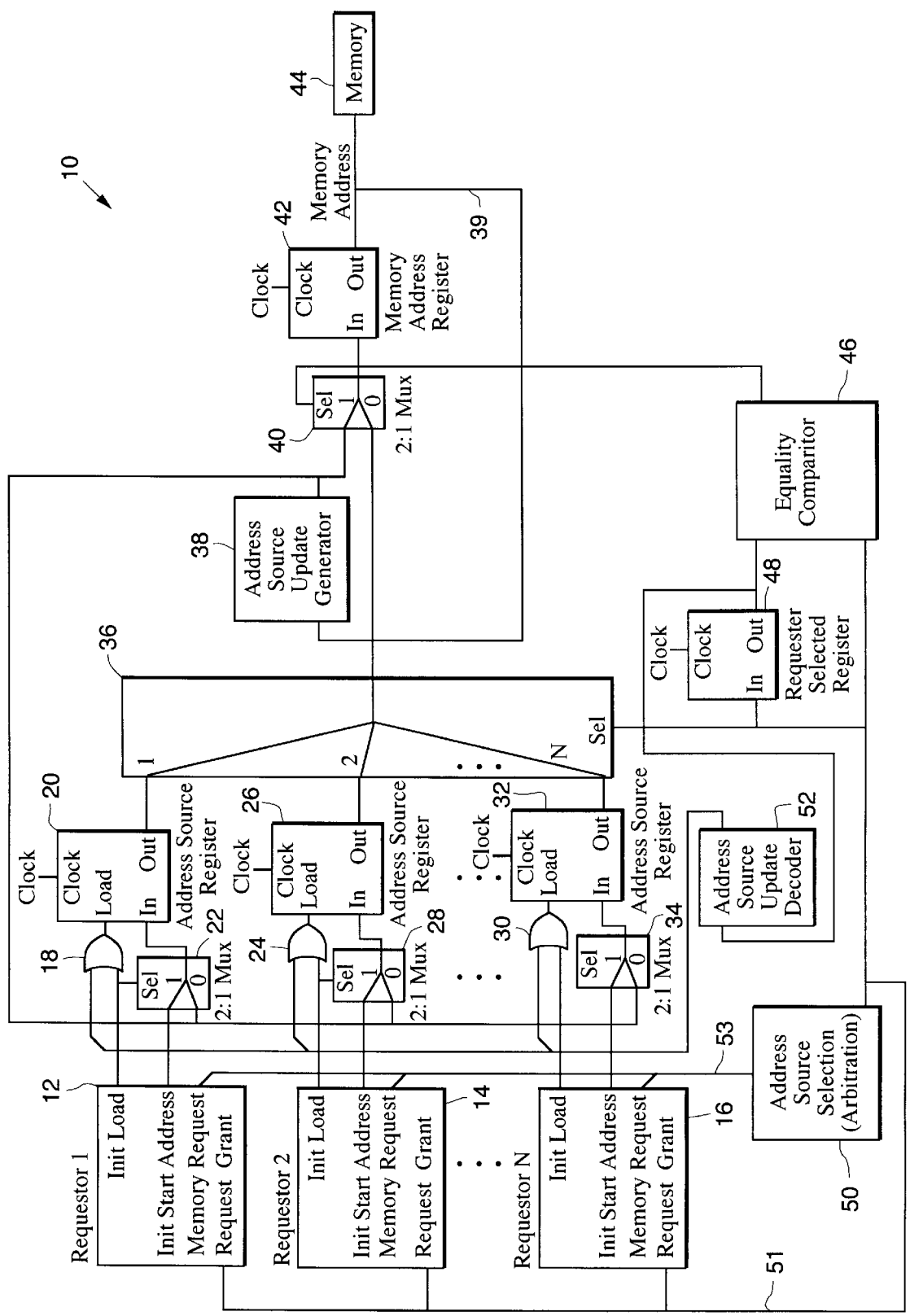

FIG. 2.

| | $t_0$ $t_1$ | $t_1$–$t_2$ | $t_2$–$t_3$ | $t_3$–$t_4$ | $t_4$–$t_5$ | $t_5$–$t_6$ | $t_6$–$t_7$ | $t_7$–$t_8$ |
|---|---|---|---|---|---|---|---|---|
| ADDRESS SOURCE REGISTER 1 | X | START ADDR. 1 | START ADDR. 1 | UPDATED ADDR. 1 | UPDATED ADDR. 1 | UPDATED ADDR. 1 | UPDATED ADDR. 1 | UPDATED ADDR. 1 |
| ADDRESS SOURCE REGISTER 2 | X | START ADDR. 2 | START ADDR. 2 | START ADDR. 2 | UPDATED ADDR. 2 | UPDATED ADDR. 2 | UPDATED ADDR. 2 | UPDATED ADDR. 2 |
| INIT LOAD 1 | 1 | 0 | 0 | 0 | 0 | 0 | 0 | 0 |
| INIT LOAD 1 | 1 | 0 | 0 | 0 | 0 | 0 | 0 | 0 |
| MEMORY REQUEST 1 | X | 1 | 1 | 0 | 0 | 0 | 0 | 0 |
| MEMORY REQUEST 2 | X | 1 | 1 | 1 | 0 | 0 | 0 | 0 |
| ADDRESS SOURCE SELECTION | X | 1 | 1 | 2 | - | - | - | - |
| REQUESTER SELECTED REGISTER | X | X | SELECT 1 | SELECT1 | SELECT2 | - | - | - |
| MEMORY ADDRESS REGISTER | X | X | START ADDR. 1 | UPDATED ADDR. 1 | START ADDR. 2 | - | - | - |

HIGH SPEED ADDRESS GENERATOR

This invention was made with Government support under Contract No. F33657-91-C-0006 awarded by the Air Force. The Government has certain rights in this invention.

BACKGROUND OF THE INVENTION

1. Field of the Invention

The present invention relates to address generators. More specifically, the present invention relates address generators for high speed buffer memories.

2. Description of the Related Art

In certain applications, there is a need to communicate a considerable amount of data at high speed. When the data can not be handled at the transmission rate, it must be buffered or stored for later processing. Conventionally, large memories are used to provide a data buffer and several processors are used to feed data to the buffer memory. A priority scheme is then used to arbitrate access to the shared memory. At one time, each processor had its own pointer to memory. The pointer was implemented as a memory address stored in a register or a section of memory and used for reads or writes of data to memory. Unfortunately, the use of multiple pointers was found to be somewhat expensive. Accordingly, a scheme was developed by which the processors accessed the shared memory using a single pointer. Whether a read pointer or a write pointer is used, the pointer must be incremented to permit subsequent reads or writes.

The single pointer scheme works well so long as one processor is not granted access to the memory during successive clock cycles. When a single processor is granted access during successive read or write cycles, there is no time to increment the pointer due to the fact that the processor is ready for the memory access in a shorter time frame than would be the case if a different processor was granted access.

Hence, there is a need in the art for a system and technique for providing for access to a shared memory by a single processor during successive read or write cycles.

SUMMARY OF THE INVENTION

The need in the art is addressed by the address generator of the present invention. The inventive generator is adapted for use with a first address source and a second address source and includes a first circuit for selectively applying the address provided by the first or the second address source to a memory during a first clock cycle. A second circuit detects a selection of an address provided by an address source for application during successive clock cycles and provides a control signal in response thereto. A third circuit increments or decrements the address and a fourth circuit applies the output of the third circuit to the memory in response to the control signal.

Each of the address sources also provide a memory access request and a load signal. In a illustrative implementation, the first circuit includes a first register for storing an address provided by an associated address source and a first multiplexer for selecting between the output of an address source and the third circuit for input to an associated first register circuit in response to a load signal from an associated address source. The first circuit also includes a second multiplexer for selecting the output of a first register for input to the memory. In addition, the first circuit includes an address source selection or arbitration circuit for providing a control signal for the second multiplexer.

In the illustrative implementation, the fourth circuit includes a third multiplexer for selecting between the output of the second multiplexer and the output of the third circuit for application to the memory in response to the control signal. The second circuit includes a second register for storing a signal from the address source selection circuit indicating the selection of the first or the second address source during the first clock cycle. The second circuit further includes a first comparator for comparing the output of the address source selection circuit to the output of the second register and providing the control signal in response thereto. The inventive address generator further includes an update decoder for providing a second load signal to a selected first register whereby the selected first register is loaded with an address provided by the fourth circuit via the first multiplexer.

Thus, an inexpensive yet effective system is provided for providing updated addresses at high speed.

BRIEF DESCRIPTION OF THE DRAWINGS

FIG. 1 is a block diagram of an illustrative implementation of the address generator of the present invention.

FIG. 2 is a timing diagram illustrative of the operation of the address generator of the present invention.

DESCRIPTION OF THE INVENTION

Illustrative embodiments and exemplary applications will now be described with reference to the accompanying drawings to disclose the advantageous teachings of the present invention.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

FIG. 1 is a block diagram of an illustrative implementation of the address generator of the present invention. The generator 10 is adapted for use with a plurality of address sources 12, 14 and 16. The address sources may be any address source used in the art so long as it provides "Load", "Start Address" and "Memory Request" type outputs and is adapted to receive a "Request Grant" type input signal. The load and address output terminals of each source are connected to an associated OR gate and first multiplexer. Thus, the first source 12 connects to an OR gate 18 and a first multiplexer 22. The second source connects to an OR gate 24 and multiplexer 28. The Nth source 16 connects to an OR gate 30 and a multiplexer 34. Each OR gate 18, 24 and 30 provides a "Load" input to an associated first register 20, 26 and 32, respectively. Each multiplexer 22, 28 and 34 receives a second input from an address source update generator 38, discussed below, and provides an input to an associated register 20, 26 and 32 respectively.

The outputs from the first registers 20, 26 and 32 are input to a single second multiplexer 36. The multiplexer 36 selects a register output for input to a third multiplexer 40 in response to a signal from a conventional address source selection (arbitration) circuit 50. The arbitration circuit 50 receives memory requests on line 51 from each source and informs each source of its selection via line 53.

A second input to the third multiplexer is provided by an address source update generator 38. The third multiplexer 40 selects between the output of the multiplexer 36 and the output of the address source update generator 38 for input to a memory address register 42. The memory address register 42 holds an address for access to a memory 44. The output of the address register 42 is fed back to the update generator 38 via a feedback path 39.

In accordance with the present teachings, an equality comparator 46 compares the current source selection as provided by the arbitration circuit 50 with the selection made during the previous clock cycle which is stored in a requester selected register 48. The output of the equality comparator 46 provides a control signal for the third multiplexer 40 whereby the multiplexer 40 is commanded to select the output of the address source update generator 38 whenever the condition of a back-to-back selection of a single source by the arbitration circuit 50 is detected. The update generator may be implemented with a simple incrementing or decrementing circuit.

An update decoder 52 of conventional design is connected between the requested selected register 48 and each of the OR gates 18, 26 and 32. The update decoder provides a load signal to the appropriate register to facilitate an updating of the register which respect to the current address as generated by the update generator via the first register 22, 28 and 34 associated therewith.

In operation, a start address and a memory request is output by the first source 12 for example. The address is input to the associated first multiplexer 22. A load signal is also provided to the multiplexer 22 and the OR gate 18. Thus, on receipt of clock pulses, the associated register 20 is commanded to load a start address from the source 12. The load signal activates the multiplexer to select the output of the source 12.

If the memory access request from the first source is granted, the arbitration circuit 50 commands the second multiplexer 36 to select the output of the register 20 associated with the first source 12. The output of the register 20 is input to memory 44 via the third multiplexer 40 and the memory address register 42.

If a second source is subsequently granted access during a subsequent cycle, the above process is repeated for the selected source and its associated elements. However, if the same source is selected for access during the second clock cycle as was selected during the first clock cycle, then in accordance with the conventional address generator design teachings, the first register 20 would be selected by the multiplexer 36 and its output would be passed to memory 44 before the address stored in the register 20 could be updated by the system to point to the next location in memory. In accordance with the present teachings, however, the back-to-back grant of access to a single source by the arbitration circuit 50 is detected by the equality comparator 46. Hence, the output of the equality comparator 46 goes high and commands the third multiplexer 40 to select the output of the address source update generator 38 for application to the memory 44.

In any event, after an initial start address is provided by a source, the address is updated by the update generator and fed back to the associated first register via an associated first multiplexer. A load signal for the register is provided by the address source update decoder 52.

FIG. 2 is a timing diagram illustrative of the operation of the address generator of the present invention. As shown in FIG. 2, during a first clock cycle, at time $t_1$, first and second address sources 12 and 14 provide start addresses to their associated registers and request memory access. On the next clock cycle $t_2$, the address source selection circuit 50 selects the first source and the start address from the first source is input to the memory address register 42. On the next clock cycle, at time $t_3$, the address selection circuit 50 selects the first source again at which time the memory address register is loaded with the updated address as is the first register associated with the selected source, in this case register 20. At time $t_4$ the second source is selected and its start address is loaded into the memory address register 42 and the operation of the circuit continues as set forth above.

Note that the arbitration is defined so as to always grant priority to the first source. Thus, the only way the second source would be granted access would be when the first source failed to make a request. Nonetheless, the invention is not limited to the manner by which the arbitration is implemented. As will be appreciated by one of ordinary skill in the art, numerous arbitration techniques are known and supported by the teachings of the present invention.

Thus, the present invention has been described herein with reference to a particular embodiment for a particular application. Those having ordinary skill in the art and access to the present teachings will recognize additional modifications applications and embodiments within the scope thereof.

It is therefore intended by the appended claims to cover any and all such applications, modifications and embodiments within the scope of the present invention.

Accordingly,

What is claimed is:

1. An address generator for use with a first address source and a second address source, the first address source and the second address source each providing a memory access request type signal and a load type signal; the address generator comprising:

first means for selectively applying the address provided by the first or the second address source to a memory during a first clock cycle;

second means for detecting a selection of an address provided by the first address source for application during a successive clock cycle and providing a control signal in response thereto;

third means for updating the address applied to the memory during the successive clock cycle; and fourth means for applying the output of the third means to the memory in response to the control signal.

2. The invention of claim 1 wherein the first means includes a first register means for storing an address provided by an associated address source means.

3. The invention of claim 2 wherein the first means further includes a first multiplexing means for selecting between the output of an address source means and the third means for input to an associated first register means in response to a load signal from an associated address source means.

4. The invention of claim 3 wherein the first means includes a second multiplexing means for selecting the output of a first register means for input to the memory.

5. The invention of claim 4 wherein the first means includes an address source selection means for providing a control signal for the second multiplexing means.

6. The invention of claim 5 wherein the fourth means includes a third multiplexing means for selecting between the output of the second multiplexing means and the output of the third means for application to the memory in response to the control signal.

7. The invention of claim 6 wherein the second means includes a second register means for storing a signal from the address source selection means indicating the selection of the first or the second address source during the first clock cycle.

8. The invention of claim 7 wherein the second means further includes a first comparator means for comparing the output of the address source selection means to the output of the second register means and providing the control signal in response thereto.

9. The invention of claim 8 including an update decoder for providing a second load signal to a selected first register means whereby the selected first register means is loaded with an address provided by the fourth means via the first multiplexing means.

10. The invention of claim 2 wherein the second means includes a second register means for storing a signal from the address source selection means indicating the selection of the first or the second address source during the first clock cycle.

11. The invention of claim 10 wherein the second means further includes a first comparator means for comparing the output of the address source selection means to the output of the second register means and providing the control signal in response thereto.

12. An address generation method for use with first and second address sources, the first address source and the second address source each providing a memory access request type signal and a load type signal, the method including the steps of:

selectively applying a first or a second address from the first or the second address source respectively to a memory during a first clock cycle;

detecting a selection of an address provided by the first address source for application during a successive clock cycle and providing a control signal in response thereto;

updating the address applied to the memory during the successive clock cycle; and applying the updated address to the memory in response to the control signal.

* * * * *